(12) United States Patent
Roberts

(10) Patent No.: US 8,901,412 B2
(45) Date of Patent: Dec. 2, 2014

(54) PHOTOVOLTAIC CELL

(75) Inventor: John Roberts, Sheffield (GB)

(73) Assignee: JDS Uniphase Corporation, Milpitas, CA (US)

( * ) Notice: Subject to any disclaimer, the term of this patent is extended or adjusted under 35 U.S.C. 154(b) by 233 days.

(21) Appl. No.: 13/121,364

(22) PCT Filed: Sep. 28, 2009

(86) PCT No.: PCT/GB2009/002313
§ 371 (c)(1),
(2), (4) Date: Mar. 28, 2011

(87) PCT Pub. No.: WO2010/035014
PCT Pub. Date: Apr. 1, 2010

(65) Prior Publication Data
US 2011/0180129 A1 Jul. 28, 2011

(30) Foreign Application Priority Data
Sep. 29, 2008 (GB) .................................. 0817803.0

(51) Int. Cl.
| H01L 31/0735 | (2012.01) |
| --- | --- |
| H01L 31/06 | (2012.01) |
| H01L 31/0304 | (2006.01) |
| H01L 31/076 | (2012.01) |
| B82Y 20/00 | (2011.01) |
| H01L 31/0352 | (2006.01) |

(52) U.S. Cl.
CPC ....... *H01L 31/035236* (2013.01); *Y02E 10/548* (2013.01); *H01L 31/03046* (2013.01); *Y02E 10/544* (2013.01); *H01L 31/076* (2013.01); *B82Y 20/00* (2013.01)
USPC ........... 136/255; 136/252; 136/259; 136/262; 257/21; 257/22; 257/201; 257/E31.033; 257 / E31.021; 438/57

(58) Field of Classification Search
CPC ....... Y02E 10/544; Y02E 10/50; Y02E 10/52; H01L 21/02521; H01L 31/035236; H01L 31/1852; H01L 31/03046; H01L 31/0735; H01L 31/035209; H01L 31/184; H01L 31/1844; H01L 27/0605; H01L 29/78681; H01L 29/452; H01L 29/7783
USPC ............ 136/255, 261, 262; 257/E31.033, 21, 257/22, 103, E31.021, E31.022, 201; 438/57
See application file for complete search history.

(56) References Cited

U.S. PATENT DOCUMENTS

| 6,147,296 | A | * | 11/2000 | Freundlich | .................... | 136/255 |
| --- | --- | --- | --- | --- | --- | --- |
| 6,566,595 | B2 | * | 5/2003 | Suzuki | ........................... | 136/255 |
| 2005/0247339 | A1 | * | 11/2005 | Barnham et al. | ............. | 136/262 |
| 2006/0083278 | A1 | * | 4/2006 | Tan et al. | .................... | 372/43.01 |

OTHER PUBLICATIONS

"Morphological and compositional variations in strain compensated InGaAsP/InGaP superlattices" (1997). R.S. Goldman and R.M. Feenstra. Department of Physics, Carnegie Mellon University, Pittsburgh, Pennsylvania.*
"Intermediate Band Quantum Dot Solar Cells" (2007). Mowafak Al-Jassim, Andrew Norman, and Mark Hanna.*
"Transmission electron microscopic study of GaAs/Ge heterostructures grown by low-pressure metal organic vapor phase epitaxy" (2000), Mantu Kumar Hudait and S.B. Krupanidhi.*
Huajie Chen, R. M. Feenstra, R. S. Goldman, C. Silfvenius and G. Landgren, "Strain variations in InGaAsP/InGaP superlattices studied by scanning probe microscopy", 1998, pp. 1-8.*
Touko Sugiura, Nobuyasu Hase, Hideo Goto, Shigeyasu Tanaka, Kazumasa Hiramatsu, Nobuhiko Sawaki and Isamu Akasaki, "Raman Scattering of InGaAsP Lattice-Matched to GaAs in the Region of Immiscibility", 1993, pp. 2718-2721.*
Takamasa Kato, Takashi Matsumoto, Takaaki Kobatake and Tetsuro Ishida, "Strain-Energy-Stabilized Growth of InGaAsP Layers on GaAs (111)A Substrates in Immiscible Region", 1987.*

* cited by examiner

*Primary Examiner* — Jennifer Michener
*Assistant Examiner* — Mayla Gonzalez Ramos
(74) *Attorney, Agent, or Firm* — JDS Uniphase Corporation

(57) ABSTRACT

The disclosure relates to multiple quantum well (MQW) structures for intrinsic regions of monolithic photovoltaic junctions within solar cells which are substantially lattice matched to GaAs or Ge. The disclosed MQW structures incorporate quantum wells formed of quaternary InGaAsP, between barriers of InGaP.

32 Claims, 12 Drawing Sheets

| Duration (secs) | Arsine feed (cc/min) | Phosphine feed (cc/min) | TMG feed (mole fraction) | TMI feed (mole fraction) | Remark |
|---|---|---|---|---|---|
| 980 | 150 | 0 | 0 | 0 | heat to 720°C, remove oxides |
| ? | 150 | 0 | 0 | 0 | cool to 670°C |
| 600 | 150 | 0 | $1.86 \times 10^{-2}$ | 0 | 500nm GaAs buffer layer |
| 31.6 | 0 | 250 | $4.2 \times 10^{-3}$ | $3.9 \times 10^{-3}$ | 12nm GaInP barrier |
| 10.3 | 2.3 | 250 | $7.7 \times 10^{-4}$ | $3.9 \times 10^{-3}$ | 44nm GaInAsP well |
| 31.6 | 0 | 250 | $4.2 \times 10^{-3}$ | $3.9 \times 10^{-3}$ | 12 nm GaInP barrier | repeat * 37

*Fig. 10*

PHOTOVOLTAIC CELL

FIELD OF THE INVENTION

The present invention relates to a photovoltaic junction having multiple quantum wells in an intrinsic region, and a photovoltaic cell comprising such a junction for generating electrical power from incident light, such as sunlight. In particular, but not exclusively, the junction may be used as the top junction in a tandem multiple junction solar cell adapted to receive highly concentrated sunlight, and having a lower photovoltaic junction based on GaAs having an absorption edge extended to longer wavelength by using multiple stress balanced quantum wells/barriers in an intrinsic region.

INTRODUCTION

US2005/0247339 describes a tandem solar cell illustrated in FIG. 7 of that document, and reproduced here as FIG. 1. The illustrated solar cell comprises a GaAs substrate 10 (with an active or passive Ge substrate as an alternative), a lower photovoltaic junction 12 grown on the substrate and adapted to generate electrical power from photons of wavelengths up to about 1040 nm, and an upper photovoltaic junction 16 grown on the lower junction and adapted to generate electrical power from photons of wavelengths up to about 720 nm. The two photovoltaic junctions are coupled using a tunnel junction 14, so that the same photocurrent passes through both junctions to be coupled into an electrical circuit by electrodes disposed underneath the substrate and on top of the upper junction.

So that the multiple semiconductor layers can be grown on top of each other with a minimum of defects which would otherwise dramatically lower the efficiency of the device, the lattice constant of each semiconductor layer must match the lattice constant of the layer underneath, and hence that of the GaAs or Ge substrate. This provides a strong constraint on the materials which can be used for each layer, which is familiar in many areas of semiconductor engineering, although some deviation from this constraint is possible as explained below.

The lower junction 12 is capable of generating electrical power from photons across the bulk of the solar spectrum at wavelengths up to about 1040 nm, with a high quantum efficiency. However, a longer wavelength absorption edge generally gives rise to a photocurrent generated at a lower junction voltage, so that much of the potential electrical power from shorter wavelength photons is lost from rapid thermalisation of liberated charge carriers, within the junction, to the band gap energy corresponding to the absorption edge. To harvest shorter wavelength photons at higher voltages the upper junction is constructed with a shorter wavelength absorption edge. This principle lies behind the development of tandem, multi-junction solar cells with three, four or more junctions, in an effort to harvest the photocurrent of each junction at the highest possible voltage. A constraint on such multi-junction tandem cells is that, when the junctions are grown as a stack such that longer wavelengths penetrate down to the junction at which they are absorbed, close to an appropriate band edge, the photocurrent of the whole stack must be the same as the photocurrent passing through each junction. The device is therefore limited by the junction generating the smallest photocurrent.

Using a standard solar spectrum and properties of each junction it is possible to calculate an expected efficiency of a multi-junction tandem device dependent upon factors such as the absorption edge of each junction. An example contour plot of efficiency against lower junction and upper junction bandgaps (which are closely related to absorption edges), taken from US2005/0247339 and relating to a tandem cell similar to that of FIG. 1, is reproduced here at FIG. 2. The properties of a lower cell formed from a GaAs p-n junction, and an upper cell formed from a GaInP p-n junction (the GaInP being of a composition which is lattice matched to GaAs) are shown as heavy cross-hairs. It can be seen that for optimum efficiency the band gap of both junctions should be lowered, equivalent to an absorption edge at longer wavelength. The strong diagonal structure of the contour plot arises from the need to match the photocurrents generated by the two junctions.

In the arrangement illustrated in FIG. 1 the absorption edge of the lower junction is extended to longer wavelengths than the approximately 880 nm that would be achieved by a simple GaAs/GaAs p-n junction by use of an intrinsic region 18 which contains thin layers (quantum wells) of an InGaAs material with an approximately 1040 nm absorption edge, although quantum effects in the thin wells change this value slightly. The InGaAs material is not lattice matched to the GaAs substrate, but each quantum well is located between barrier layers of a GaAsP material which provide a compensating lattice mismatch. As long as the quantum wells and barriers are sufficiently thin, and the lattice constants, elastic coefficients, and thicknesses of the layers are balanced, the intrinsic region can be grown with very low defect levels to match the lattice constant of the GaAs substrate. "Stress balanced" techniques for achieving such conditions are described in WO03/012881.

The upper GaInP cell is similarly structured with an intrinsic region containing quantum wells in which the Indium concentration is increased to shift the absorption edge to longer wavelengths. The increased lattice constant in these quantum wells is balanced by intervening barriers having a reduced Indium concentration, so that the intrinsic region formed from the barriers and wells has a lattice constant matching that of the adjacent GaInP bulk regions, and the underlying GaAs substrate.

To maintain an effective built-in electric field across the intrinsic region, such that photo-generated charge carriers are separated by the electric field rather than relying on diffusion, the concentration of doping impurities must be kept very low. A lower impurity concentration enables the built-in electric field to be maintained across a thicker intrinsic region, but practical lower limits to the impurity concentration limit the thickness of the intrinsic region to around 500 nm to 1500 nm. The techniques described in WO03/012881 permit a well/barrier intrinsic region to be constructed to such thicknesses without significant defects arising through internal stresses, but since the absorption cross section of the quantum wells depends on their total thickness summed across the intrinsic region which is itself of limited thickness, thicker quantum wells and thinner barriers are desirable.

In this light, the use of a quantum barrier/well intrinsic region in the upper junction formed of GaInP presents some problems. To match the lattice constant of GaAs the Gallium/Indium ratio in GaInP should be about 0.51/0.49, with a resulting absorption edge of about 670 nm. To suitably extend the absorption edge in the quantum well layers to about 720 nm requires a Gallium/Indium ratio of about 0.4/0.6, at which point the barriers are about twice the thickness of the wells to achieve a stress balance. In many spectral conditions it would be desirable to go to longer wavelengths than 720 nm requiring significantly wider barriers. This uses up valuable thickness in the intrinsic region, reducing the potential total thickness and hence absorption cross section of the quantum well material. Furthermore, the requirements of the stress balance condition limit the choices of quantum well and barrier thicknesses which enable one to achieve a certain absorption edge. It would be advantageous to have more flexibility in the options for design of the quantum well system.

In addition, successive barrier and well layers of GaInP based materials are difficult to grow as a perfect solution, and without unwanted ordering of the group III Gallium and Indium materials whereby the Gallium and Indium atoms tend to form single-species regions on adjacent (111) planes, rather than being well mixed within the crystal structure.

It would therefore be desirable to provide an alternative barrier/well structure based on GaInP which has an extended wavelength absorption edge, and more particularly such a structure which can be grown as part of a device on a GaAs or Ge substrate. It would also be desirable for such a structure to permit a relatively greater proportion of quantum well thickness within the structure, and a greater flexibility for choice of well and barrier thickness. It would also be desirable for such a structure to permit more reliable, defect free growth, and a more reliably disordered mix of group III species.

SUMMARY OF THE INVENTION

The invention provides a photovoltaic junction having an intrinsic region comprising a series of quantum wells formed of an InGaAsP quaternary material. Such a compound enables the absorption edge obtained using a tertiary GaInP material to be extended to longer wavelengths.

It has been found that this quaternary material can be grown with good mixing of the group III atoms, to provide the high material quality which is critical in forming a quantum well photovoltaic junction for high efficiency operation. By suitable adjustment of the complementary In and Ga proportions and the complementary As and P proportions, the absorption edge of the material can be controlled over a significant range of wavelengths as may be desired, for example, to tune the performance of the junction when used in a tandem solar cell, while at the same time yielding a well material with a required lattice parameter. In this way, for example, materials described in detail below which are closely lattice matched to GaAs (or another substrate such as Ge) with a tunable band edge between about 700 nm and 800 nm in wavelength can easily be obtained, although a range of about 700 nm to 740 nm is particularly useful in some of the described applications. Similar materials which are not lattice matched to the substrate, but which are used in a stress balanced structure with compensating barrier structures can also be obtained.

Preferably, at least some of the quantum wells are formed of, or comprise, or comprise one or more layers of, an InGaAsP quaternary material in which the relative proportions of As and P are given by $As_y$ and $P_{1-y}$ where $0.2<y<0.5$, and more preferably $0.25<=y<=0.45$, in each case optionally lattice matched to GaAs or another substrate material. In the prior art such a bulk material is predicted and found by experiment to be immiscible (K. Onabe, Jpn. J. Appl. Phys., 21, 797, 1982 and experiments by the inventors). However, it is now found that in quantum well structures the material can be produced with good material quality, as evidenced by a high photoluminescence signal, narrow photoluminescence peak width, low background impurity levels, and dark current characteristics typical of material dominated by radiative recombination at high illumination intensities. Intrinsic regions with up to fifty such quantum wells and beyond are observed to remain depleted.

The composition of the well material (and similarly the barrier material) should generally be lattice matched to within, say, 2% of the substrate lattice constant, but this will depend on the degree to which stress balancing and/or other techniques are used. As a guide, suitably accurate lattice matching to allow tens of quantum wells to be constructed may be taken to be as within about 0.1%, and more preferably about 0.03% of the substrate lattice size. Where stress balancing is used with tens of quantum wells, the quantum well/barrier structure should have a calculated free-standing lattice constant subject to similar constraints.

The invention may also be defined by requiring monolithic growth of the discussed photovoltaic junction, with or without intervening monolithic layers between the junction and an underlying substrate, which may for example be of Ge, GaAs, or another material having a similar lattice constant including virtual substrates, Si or Ge an insulator and so forth. According to one such embodiment, if $a_s$ is the lattice constant of the substrate surface on which the device is grown, $a_{GaAs}$ is the lattice constant of GaAs, and $a_{Ge}$ is the lattice constant of Ge, either:

$$-0.001 < \frac{a_s - a_{GaAs}}{a_{GaAs}} < +0.001$$

or $$-0.001 < \frac{a_s - a_{Ge}}{a_{Ge}} < +0.001$$

for GaAs or Ge matching respectively. This corresponds to the 0.1% condition mentioned above, and could be adjusted to reflect the 0.03% and 2% values also mentioned.

In order to operate effectively, the quantum wells preferably have a thickness of at least 2 nm. Similarly, the thickness is preferably less than about 15 nm, and more preferably less than 10 nm. The number of quantum wells can be adapted to provide desired amounts of photo absorption and current. Preferably, however, at least 15, and more preferably at least 20 quantum wells are used.

The quantum wells are separated by barrier layers. Conveniently, these may be of tertiary GaInP material. The alternate barrier and well layers may then be grown using an epitaxial technique by turning the Arsenic source on and off. Because Arsenic atoms generally incorporate into the epitaxial growth much more easily than Phosphorous atoms, much less Arsenic feed material is required than Phosphorous feed material and only small changes in the amount of Arsenic feed material is required, hence the proportion of Arsenic incorporated can be controlled accurately and simply. The barriers may more generally be formed of a semiconductor material comprising Ga, In and P, including quaternary materials further incorporating, for example, Al, As, N or Sb.

An alternative material for wells between GaInP barriers, to achieve an extended wavelength band edge in a junction lattice matched to GaAs or Ge, is GaAs. However, to construct such a series of barriers and wells requires additional turning on and off of the much larger flow required for the Phosphorous feedstock. Moreover, the GaAs wells provide a much longer wavelength band edge than is possible using InGaAsP, so that the built in voltage of the photovoltaic junction may then be too low for many purposes. Additionally, the band edge of the wells will not be composition tunable using this material.

The lattice constant of the well material may be different to that of the barrier material, in which case the wells and barriers should be stress balanced with respect to the substrate, that is the alternate compressive and tensile stresses in the barriers and wells should balance at a common lattice spacing which matches that of the underlying substrate (and/or that of bulk semiconductor regions above and below the wells and barriers). To avoid defects and achieve good material quality for a large number of quantum wells, for example thirty or more wells, this stress balancing requires a consideration of elastic coefficients of the materials as well as layer thickness and lattice constants.

Conveniently, however, the materials of the wells and barriers may be chosen such that the lattice constants of the well material and the barrier material both substantially match that of the substrate. This permits the thicknesses of the well and barrier layers to be chosen independently of stress balancing constraints. This can help allow a greater total thickness of quantum wells in the intrinsic region.

In particular, if the underlying substrate is GaAs or Ge or lattice matched at a top surface to GaAs or Ge, the barriers may be formed of a tertiary GaInP material and the wells of a quaternary InGaAsP material both having compositions causing them to be substantially lattice matched to GaAs or Ge. Conveniently, the bulk semiconductor layers, either or both above and below the intrinsic region, may also be formed of an GaInP material, or more generally a semiconductor material comprising Ga, In and P, including quaternary materials incorporating a fourth element such as Al, As, N or Sb, again lattice matched to GaAs or Ge if required. Virtual substrates may also be used to provide an underlying substrate of appropriate lattice spacing.

According to one variation, the InGaAsP wells may be grown as stepped wells, by incorporating a subwell of GaAs separated from the barrier layers (typically of GaInP) by the quaternary InGaAsP material. This inclusion of GaAs subwells, to form stepped wells of InGaAsP—GaAs—InGaAsP, can extend the band edge of the structure out to a wavelength of about 850 nm. The InGaAsP layers help to stabilize the transition from GaInP which is free of As, to GaAs, which is free of P.

Preferably, the junction is formed monolithically with the solar cell substrate. The junction may be formed monolithically with one, more, or all other tandem junctions of the device.

The invention also provides a solar cell comprising the photovoltaic junction discussed above, a semiconductor substrate, and electrodes arranged to couple photocurrent and photo voltage from the junction to a load.

The solar cell may comprise two, three, four or more photovoltaic junctions, in particular arranged in a tandem configuration such that the same photocurrent passes through all of the junctions. In such an arrangement, the ability to tune the absorption band edge of one or more of the junctions is important in order to match the photocurrents of each of the junctions under typical illumination conditions, and the use of InGaAsP wells in one or more of the junctions contributes to this.

In particular, the photovoltaic junction having wells of a quaternary InGaAsP material may provide an upper junction arranged to receive incident light from any overlying layers, the solar cell further including at least one lower junction arranged to receive light from the upper junction. The light received at the lower junction may be incident light not absorbed by the upper junction, but may also comprise photons emitted by the upper junction by a process of radiative recombination of charge carriers in the quantum wells.

Generally, the lower junction will be characterised by an absorption edge having a longer wavelength than the upper junction, for example being based on GaAs materials such as GaAs, GaAsP and InGaAs. In particular, the lower intrinsic region may comprise an intrinsic region having quantum wells of InGaAs separated by quantum barriers of GaAsP. A suitable solar cell may use between about twenty and a hundred quantum wells of InGaAs, stress balanced with the barriers of GaAsP to match the lattice constant of an underlying GaAs or Ge substrate. The wells of the lower junction may preferably be characterised by an InGaAs material having an absorption band edge wavelength of greater than 1000 nm (which compares with the band edge of a conventional GaAs junction of about 875 nm), or more preferably greater than 1020 nm. Such a lower junction can be formed to provide significantly increased photocurrent at typical illuminations compared with a conventional GaAs photovoltaic junction, such that a conventional GaInP upper junction provides insufficient photocurrent to match. The use of quantum wells of quaternary InGaAsP material in the upper junction can then be used to provide a matching photocurrent, which is furthermore tunable by adjustment of the composition and well thickness to optimise the solar cell over a wide range of illumination conditions.

The photovoltaic junctions and solar cells discussed may particularly be used as concentrator cells, operated under conditions of intense illumination for example where solar light is concentrated, for example at least about 50 times, or more preferably at least 100 times at the solar cell surface. To this end the invention also provides apparatus comprising one or more solar cells as discussed above, a solar concentrator arranged to direct concentrated sunlight to the one or more solar cells, and electrical circuitry arranged to gather electrical power from the one or more solar cells.

The invention also provides a method of forming a photovoltaic junction using an epitaxial growth technique, for example MOVPE, in a reaction chamber, comprising: growing a first bulk semiconductor layer; growing on top of the first bulk layer an intrinsic region comprising barrier layers alternating with quantum well layers of a quaternary InGaAsP material; and growing a second bulk semiconductor layer on top of the intrinsic region. The barrier, quantum well and bulk semiconductor layers may have the various combinations of properties discussed above, and the junction may be grown as part of a multiple junction photovoltaic device. In particular the barrier layers may be formed of GaInP, one or both of the bulk semiconductor regions may be formed of GaInP, and the substrate may be GaAs or Ge or a virtual or other substrate having a front surface or exhibited lattice constant substantially matching that of GaAs or Ge.

Preferably the junction, and preferably any also other photovoltaic junctions, are grown monolithically with each other and with the substrate, to form a monolithically grown solar cell device, although of course some other steps such as metallisation will usually be required.

The invention may also be used in applications other than solar cells and other photovoltaic junctions, for example LEDs, lasers, and photodiodes, and therefore provides an electronic and/or optical device having a p-i-n junction, the intrinsic region of this junction comprising a series of quantum wells formed of an InGaAsP quaternary material. Preferably, the quantum wells have other properties as applicable and as set out above, such as being lattice matched to a GaAs substrate.

BRIEF DESCRIPTION OF THE DRAWINGS

Embodiments of the invention will now be described, by way of example only, and with reference to the drawings, of which:

FIG. 10 summarises an epitaxial growth scheme for a multiple quantum well structure embodying the invention;

DETAILED DESCRIPTION OF EMBODIMENTS

Figure 3:
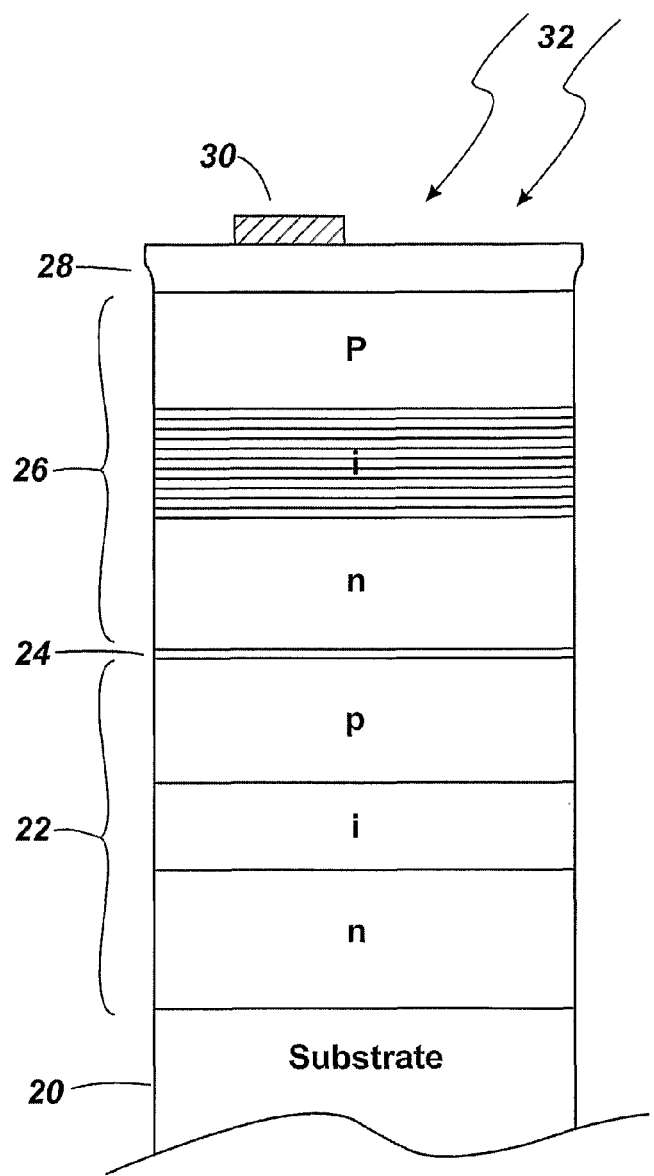
FIG. 3 illustrates the structure of a tandem junction solar cell according to a first embodiment of the invention.
Figure 3:
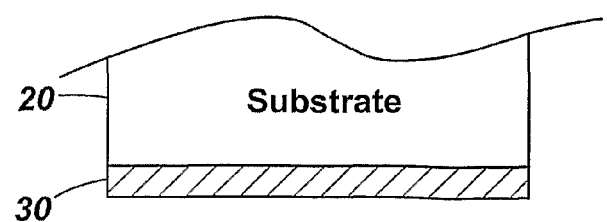

Referring now to FIG. 3, the structure of a solar cell according to a first embodiment of the invention is shown schematically. Not all layers are necessarily shown in the diagram. Broadly, the cell comprises a substrate 20 on which is formed a lower photovoltaic junction 22. A tunnel junction 24 is formed on top of the lower junction 22, and an upper photovoltaic junction 26 is formed on the tunnel junction 24. Structures overlying the upper photovoltaic junction may include a window layer 28, and electrodes 30 will typically be provided on the window layer and underneath the substrate. The solar cell is operated by providing illumination 32, typically concentrated solar illumination, at the top of the cell, and drawing the generated electrical power by connections to the electrodes 30. The upper photovoltaic junction absorbs incident photons having an energy higher than a band edge of the junction. Photons of lower energy pass through to the lower junction which has a lower energy band edge. Since a higher energy band edge material generally provides a higher junction voltage, photons of the incident light are thereby used to generate current at a higher voltage where possible, while lower energy photons are collected by the lower junction and not wasted.

Each of the lower and upper photovoltaic junctions is illustrated as a p-i-n junction. For such junctions it is usually intended that, in operation, the intrinsic regions i should be fully depleted so that charge carriers generated by the illumination 32 within the intrinsic regions are carried to the adjacent p- and n-doped bulk semiconductor regions by the electric field of the junction. Of course, in this and other examples the polarity of the doping may be reversed if desired.

The intrinsic region of the upper junction is formed from a plurality of quantum wells, each well comprising an InGaAsP material.

The choice of other materials in the solar cell will depend on various factors and constraints, and a particular detailed example is given below in the second embodiment. Typically, the substrate may be of GaAs or Germanium, and the lower photovoltaic junction may be a GaAs based junction. In particular the lower junction may be a p-i-n junction and have bulk semiconductor regions formed of GaAs. The intrinsic region of the lower junction may itself contain quantum wells, for example to extend the band edge of the junction to longer wavelengths. These wells and surrounding barriers may be stress or strain balanced in ways discussed in the prior art and elsewhere in this document, for example to enable the band edge of the intrinsic region to be extended to longer wavelengths. This is may be important for the device to make better use of the available spectrum of incident light. There may be other photovoltaic junctions in the device, between, above or below the lower and upper junctions, and/or the lower junction may be omitted.

The quantum wells of the illustrated upper junction are disposed between quantum barriers. These barriers may be of tertiary GaInP, or a GaInP based quaternary, and one or both of the bulk p- and n-regions of the upper junction may similarly be composed of GaInP or a GaInP based quaternary, although other materials may be used, as may more complex structures surrounding the intrinsic region. Typically, the bulk p- and n-regions and materials of the quantum wells and barriers may be lattice matched to the lower photovoltaic junction and the underlying GaAs or Ge substrate, although strain/stress balanced wells and barriers may be used if desired as described elsewhere in this document. Using quantum wells of InGaAsP in this structure allows the band-edge of the intrinsic region to be extended to longer wavelengths. This can be used to control the photocurrent of the upper junction to better match that of an underlying junction, such as the discussed GaAs based junction.

An Arsenic fraction of between about 0.25 and 0.45 is found suitable for the InGaAsP, especially for a material lattice matched to within about 2% with GaAs. The proportion of the group III elements can be adjusted to provide a suitable lattice size, for example to match a particular substrate or balance a complementary barrier composition with respect to a substrate.

One or more reflective structures such as mirror or Bragg reflector structures may be included in the solar cell to reflect photons of incident light or photons generated by radiative recombination in the junctions back into the junctions. Such a structure may, for example, be disposed between the lower photovoltaic junction and the substrate.

Figure 4:
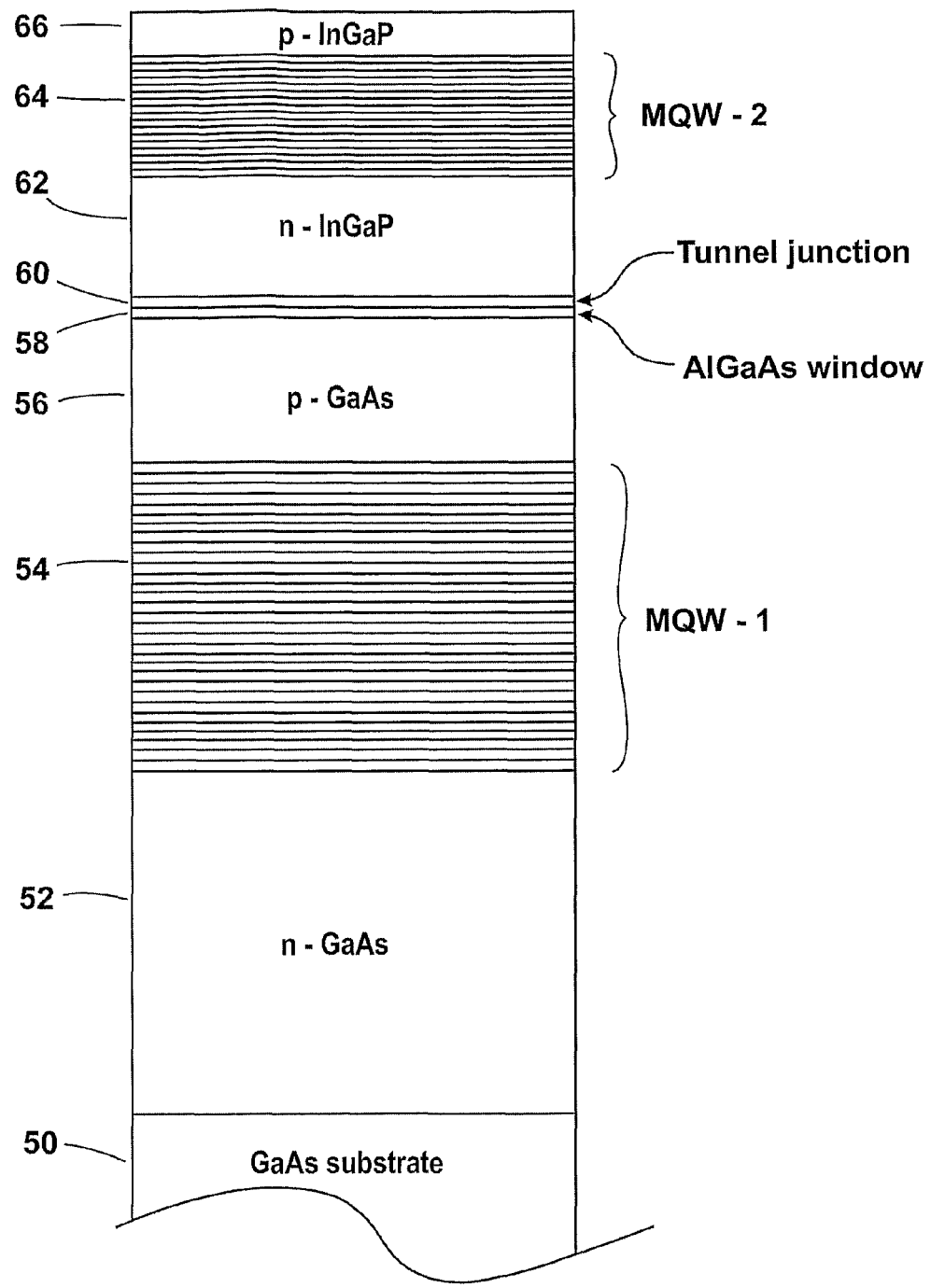
FIG. 4 illustrates the structure of tandem junction solar cell according to a second, more detailed embodiment of the invention.

Referring now to FIG. 4, the structure of a second embodiment of the invention is illustrated. This is a more detailed example of a structure according to the first embodiment, although some aspects such as electrodes are omitted for clarity. This second embodiment may be adapted and used in various ways as discussed above in respect of the first embodiment. Particular details of the second embodiment may also be applied to the first embodiment in various ways as will be apparent to the skilled person. For example, details of the upper photovoltaic junction of the second embodiment may be used in various different solar cell structures as generally discussed in respect of the first embodiment.

The solar cell of the second embodiment is grown using metal organic vapour phase epitaxy (MOVPE) on a GaAs substrate 50, although other epitaxial techniques may be used. The principal layers illustrated, in order moving away from the substrate, are a lower photovoltaic junction, a tunnel junction, and an upper photovoltaic junction. As shown in the figure the lower photovoltaic junction comprises an n-doped GaAs bulk semiconductor layer 52, a first multiple quantum well (MQW) structure 54, and a p-doped GaAs bulk semiconductor layer 56. An AlGaAs window layer 58 is then provided, followed by tunnel junction 60. The upper photovoltaic junction comprises an n-doped GaInP bulk semiconductor layer 62, a second multiple quantum well structure 64, and a p-doped GaInP layer.

The lower multiple quantum well structure includes several tens of thin layers, preferably thirty layers or more, of a quantum well material which has a longer wavelength band edge than the surrounding bulk GaAs material. The band edge of the well material preferably extends to a wavelength beyond 1000 nm, for example to 1020 nm, 1040 nm or even as far as 1100 nm, to make better use of an incident solar spectrum as described in the prior art. This can be achieved in various ways as described, for example, in US2005/0247339, and US2003/0089392 (both of which are hereby incorporated by reference for all purposes). In the second embodiment described herein the wells of the lower junction are formed by using an InGaAs tertiary material which has a larger lattice parameter than the surrounding bulk material and/or substrate. To avoid the formation of lattice defects which would otherwise increase carrier recombination in the junction to an extent which would unduly reduce efficiency, quantum barrier layers between the wells are formed from a material which has a correspondingly smaller lattice parameter, in this example using a GaAsP tertiary material, so that when layer thicknesses, lattice parameters and material elastic coefficients are taken into account the quantum well structure has an overall lattice parameter which matches that of the substrate.

The upper quantum well structure is similarly structured but uses multiple quantum wells formed of a quaternary InGaAsP material between barrier layers of a tertiary GaInP material. In the second embodiment both the wells and barriers of the upper junction are of materials which are lattice matched to the surrounding GaInP bulk regions, and also to the GaAs substrate, rather than being strain or stress balanced in the manner of the first quantum well structure, although such a scheme could be used if desired.

In more detail, the layers of the solar cell of the second embodiment from the substrate upwards may be provided largely as follows:

GaAs substrate—use of a (100) substrate cut at 10 degrees to the 111 plane may be used instead of a conventional (100) 3 degree to [100] substrate, to help increase disordering of group III atoms in the GaInP layers (more than 2 degrees, and preferably more than 7 degrees from the <111> or <110> crystal plane is also of benefit);

100 nm thick layer of GaAs n-doped with silicon atoms to a density of $1 \times 10^{18}$ cm$^{-3}$;

2000 nm GaAs n-doped with $2 \times 10^{17}$ cm$^{-3}$ silicon atoms;

50 quantum wells each 6.8 nm thick of $In_{0.23}Ga_{0.77}As$ separated by quantum barriers each 28.6 nm thick of $Ga_{0.89}AsP_{0.11}$, with half thickness barriers outside the end wells, the wells being characterised by a photoluminescence peak at 1016 nm with a full width half maximum of 57.7 meV;

10 nm GaAs undoped;

400 nm GaAs emitter p-doped with $2 \times 10^{18}$ cm$^{-3}$ carbon atoms;

43 nm $Al_{0.8}Ga_{0.2}As$ p-window;

tunnel junction of 15 nm $Al_{0.45}Ga_{0.55}As$ heavily p-doped and 15 nm GaAs heavily n-doped with silicon atoms;

30 nm AlInP, n-doped minority carrier reflector with silicon atoms;

570 nm GaInP lattice matched to GaAs and n-doped with $1 \times 10^{17}$ cm$^{-3}$ silicon atoms;

22 quantum wells each 4.4 nm thick of GaInAsP (see below for composition) separated by quantum barriers each 15.4 nm thick of GaInP, all lattice matched to GaAs (or very closely matched, exhibiting very slight strain balancing), the wells being characterised by a photoluminescence peak at 716 nm at the centre of the 4 inch wafer used, with an x-ray period of 19.8 nm;

60 nm GaInP lattice matched to GaAs, doped with $1 \times 10^{18}$ cm$^{-3}$ Zinc atoms;

40 nm GaInP lattice matched to GaAs, doped with $3 \times 10^{18}$ cm$^{-3}$ Zinc atoms 30 nm AlInP lattice matched to GaAs, doped with $5 \times 10^{11}$ cm$^{-3}$ Zinc atoms;

150 nm GaAs p-doped with $1 \times 10^{20}$ cm$^{-3}$ carbon atoms.

Suitable electrode contacts and protective layers are then added as desired.

The proportions of In and P in the GaInAsP quantum wells is not specified in the above listing of layers. The band edge of the wells, and thereby the properties of the solar cell can be tuned by varying these proportions, especially the relative proportions of Indium and Phosphorous, and the proportions of Ga and As can be adjusted to ensure that the wells remain lattice matched to GaAs. According to "Semiconductors: Data Handbook", O. Madelung, Birkhauser 2004, pp 167-168, GaInAsP can be matched to GaAs for all values of y according to:

$$Ga_{(1+y)/2.08}In_{1-(1+y)/2.08}As_yP_{1-y}$$

Figure 1:
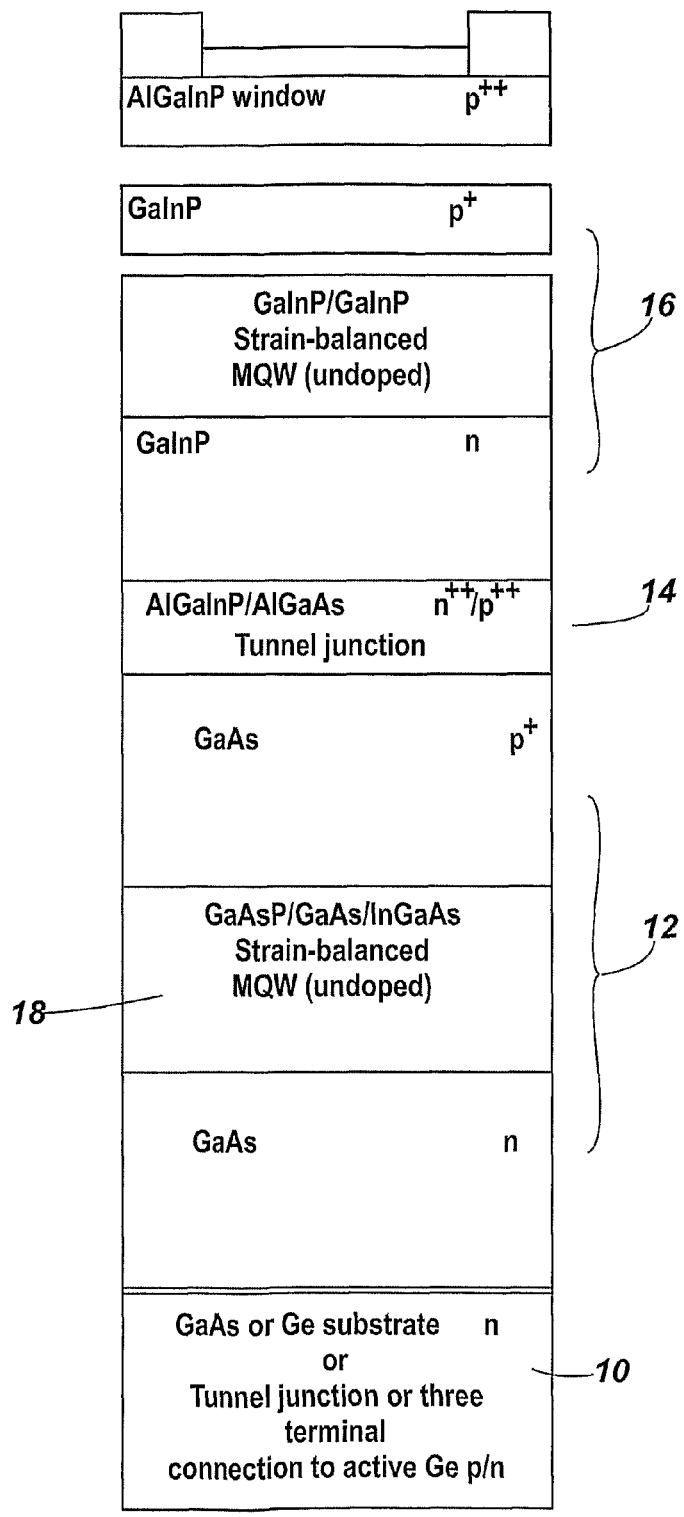
FIG. 1 shows a tandem solar cell discussed in US2005/0247339.
Figure 2:
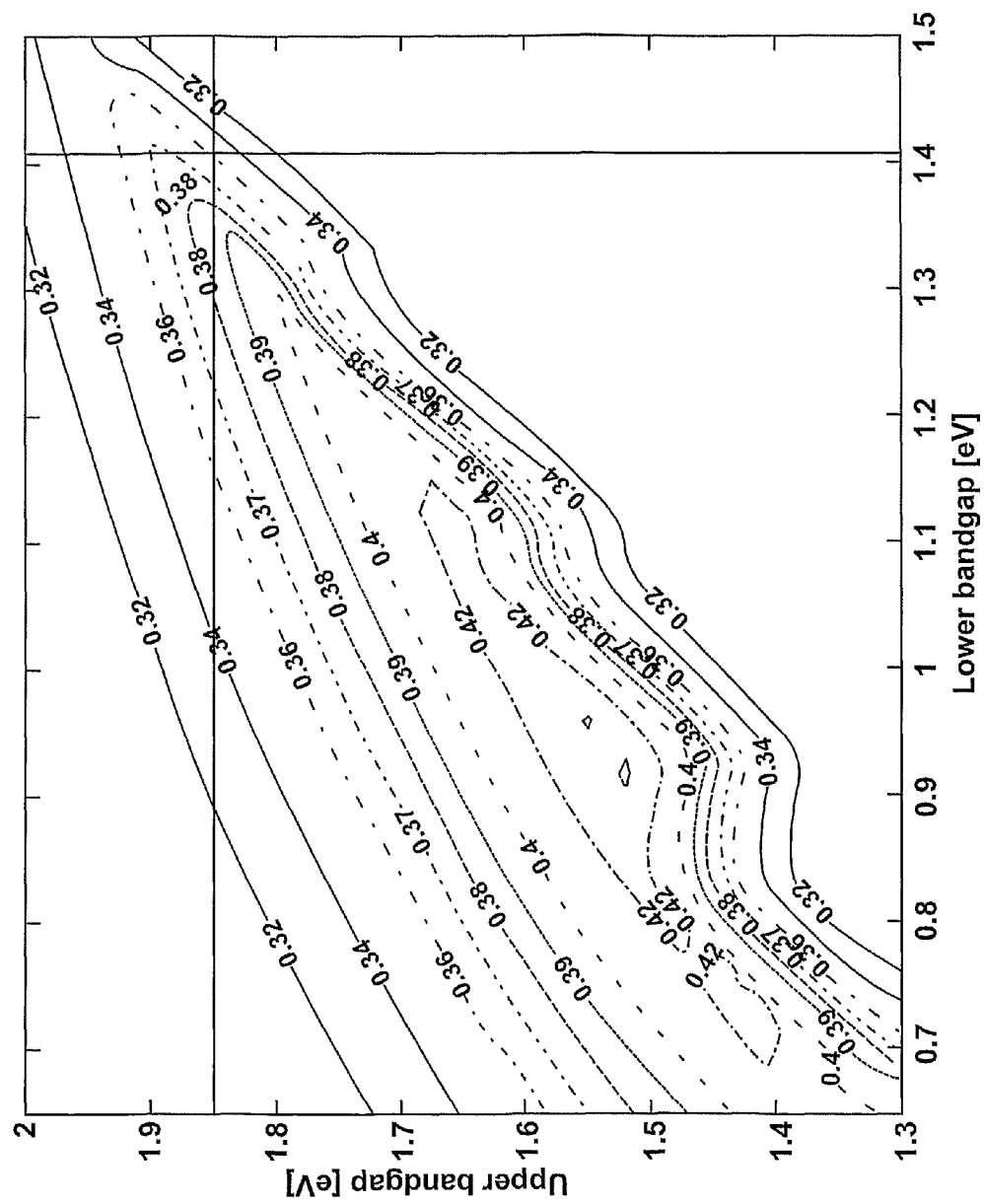
FIG. 2 is a plot of efficiency for a range of band gaps of top and bottom junctions of a tandem solar cell similar to that of FIG. 1 under typical solar illumination.

The full range of values from y=0 to y=1 provides a band gap range for the wells of the second quantum well structure of about 1.42 eV to about 1.9 eV. One suitable value for y in respect of the present invention lies at about y=0.33, for which the composition $Ga_{0.66}In_{0.34}M_{0.33}P_{0.67}$ applies. Another suitable composition to lattice match to GaAs is $Ga_{0.705}In_{0.295}As_{0.4}P_{0.6}$, providing absorption to about 724 nm for a quantum well of 4.4 nm thickness. Values of y at least from about 0.25 to 0.45 are suitable, and optionally from about 0.2 to about 0.5, for GaInAsP compounds lattice matched to within a few percent (e.g. 2%) to GaAs or Ge. In this range the quaternary GaInAsP quantum wells increase the photocurrent of the upper junction moderately, and sufficiently for the photocurrent of the upper junction to match that of the lower GaAs based junction, without seriously lowering the voltage output of the upper junction. At y=0.33 the band edge of the wells lies at around 70 nm, some 40 nm above that of a bulk GaInP photovoltaic junction at about 650 nm. The material compositions of the wells of the lower junction can also be adjusted to control band edge and similar properties, providing further control to optimise the solar cell for particular spectral conditions as alluded to above in the discussion of FIG. 2.

Figure 5:
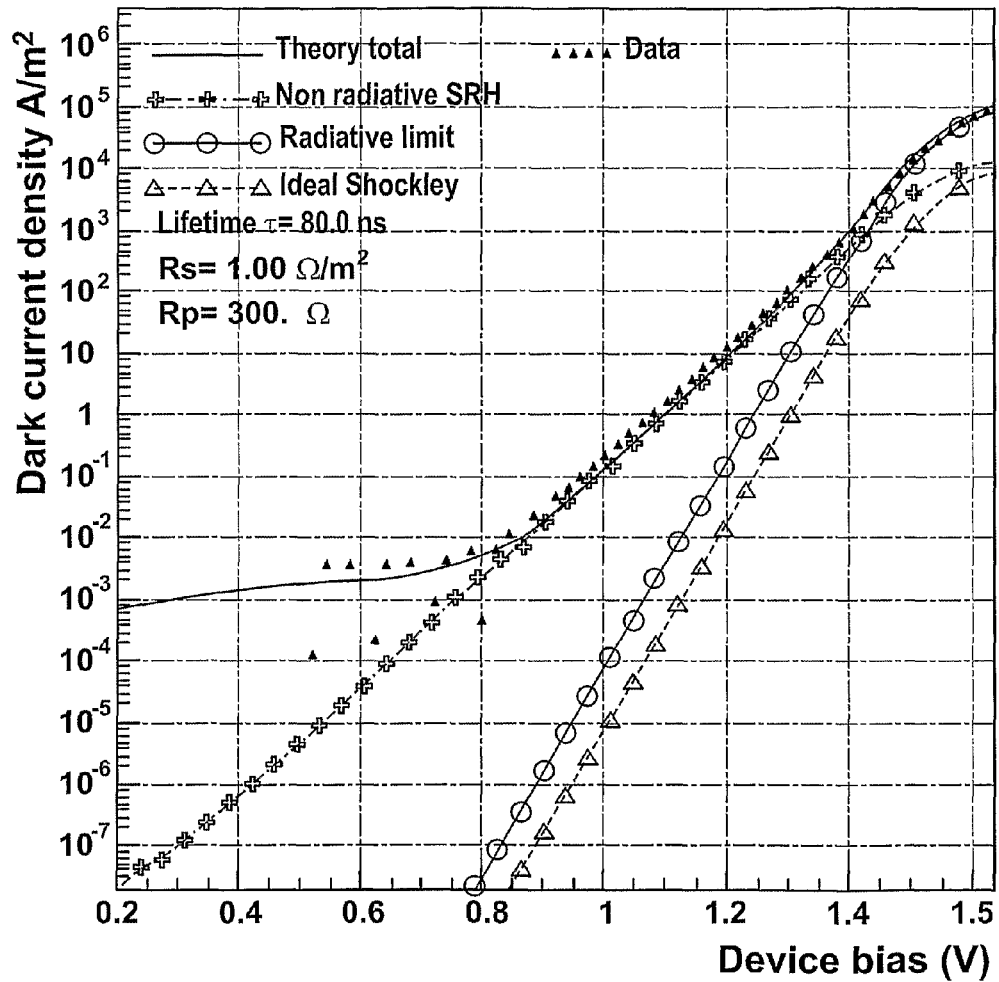
FIG. 5 is a plot of measured and modelled dark current for a top photo-junction according to the second embodiment, based on GaInP and including 22 quantum wells of InGaAsP in the intrinsic region. The steeper slope at a bias around 1.4V (near to the operating voltage of the cell) and the proximity to the prediction of the curve marked "radiative limit" both indicate good material quality consistent with the domination of radiative combination.
Figure 7:
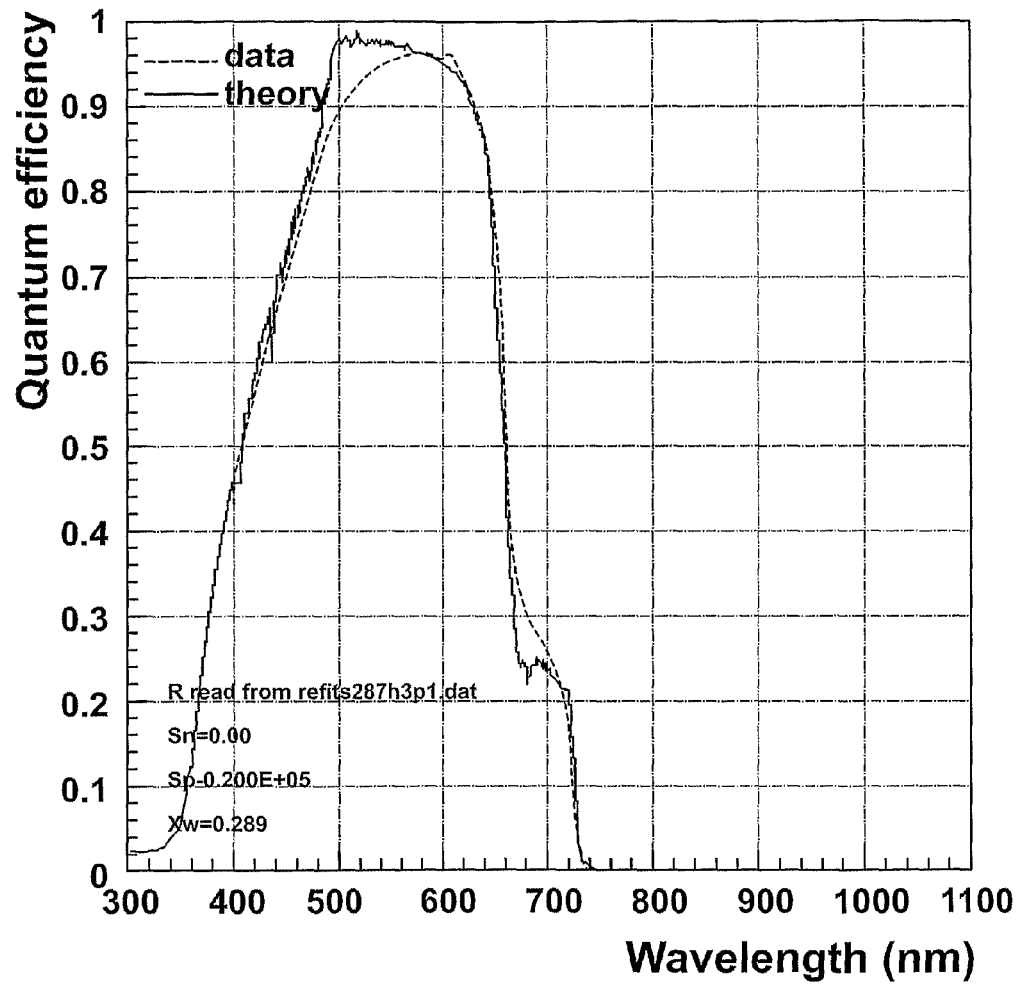
FIG. 7 is a plot of measured and modelled internal quantum efficiency for the device of FIG. 5.

FIG. 5 shows the dark current (heavy points) measured in a laboratory test of the upper photovoltaic junction of the tandem device embodying the invention described in detail above. Specifically, the tested device used InGaAsP quantum wells substantially lattice matched to GaAs (the tested device was grown with a very slight strain balance between the wells and barriers to match the intrinsic region lattice constant with the substrate), with an Arsenic fraction of about 0.28 and an Indium fraction of about 0.66 (accurate lattice matching would require an Indium fraction of about 0.64). This composition lies within the "immiscibility gap" reported in the above K. Onabe reference, but FIGS. 5 and 7 show that it can be successfully grown as a thin quantum well structure with high luminescence, and hence also radiation absorbing efficiency.

The dark current is the diode current which results when the photovoltaic junctions of the junction are not illuminated, but are forward biased in the direction of expected diode conduction using the voltage of the abscissa. To measure the dark current from the upper junction of a tandem device a test device including only the upper junction is grown.

Since the overall performance of the junction being tested can be approximated by the open-circuit photocurrent minus the dark current, a lower dark current is generally indicative of improved solar cell performance. Since higher forward bias gives rise to larger dark currents in the device, it also acts as a proxy for behaviour under higher illumination levels.

The tested device has also been simulated using the "SOL" model described in "Efficiency limits of quantum well solar cells", J. P. Connolly et al., Proc. 19th European Photovoltaic Solar Energy Conference, Paris, June 2004, pp 355-359. A single free parameter, the carrier lifetime, is adjusted to achieve a good model fit (shown as solid line, "theory total") to the data, and has a value of 90.0 ns here. The value Rs shown in the graph is the series internal resistance of the device, which impacts the dark current above about $10^3$ A/m$^2$, causing the dark current density to tail off towards a linear function of device bias (noting that FIG. 5 is a linear-log plot). The model also enables theoretical limits to performance, based on various assumptions, to be shown for comparison. The line with triangle points shows the much lower current expected from the Shockley equation for ideal diode behaviour which balances carrier diffusion against drift in the intrinsic p-n junction electric field. The line with circle points shows the current expected in the radiative limit, when the photo recombination of charge carriers which is the inevitable reverse process to photo generation of charge carriers is allowed for. The line with plus points also allows for non-radiative Shockley-Read-Hall carrier loss by recombination through trap states which are associated with lattice defects and similar imperfections.

In FIG. 5, the radiative limit and ideal Shockley curves are separated only by about one order of magnitude. Importantly, both the measured and modelled dark current approach and meet the radiative limit curve at high biases and current densities. Since higher bias in a dark current measurement is a proxy for higher illumination levels under operative conditions of the solar cell, it can be seen that this cell approaches a theoretical radiative limit of efficiency under high illumination levels, corresponding in this case to about 100-200 times standard solar illumination. This is achieved by reducing carrier loss through non-radiative mechanisms to negligible levels, which in turn is indicative of a very good material quality of the quantum well and barrier materials, and an ability to yield very high efficiency solar cells.

Figure 6:
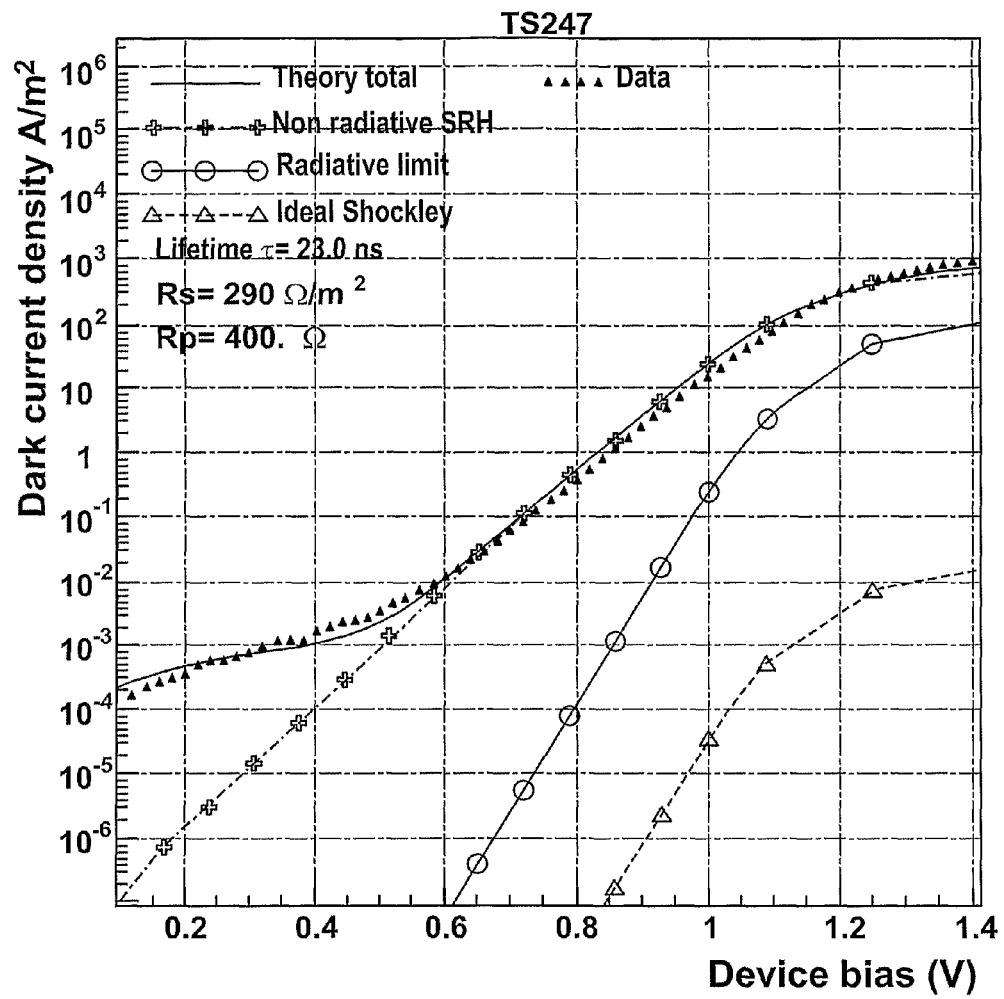
FIG. 6 is a plot of measured and modelled dark current for a photo junction based on GaInP including 5 quantum wells of GaAs in the intrinsic region. The significantly higher dark current (a factor of approximately 100 at 1V bias) indicates much higher recombination and lower cell efficiency than the cell in FIG. 5.

For comparison with FIG. 5, FIG. 6 shows equivalent dark current curves for a test device which exhibits much poorer performance. The device incorporates an upper photovoltaic junction based on GaInP lattice matched to GaAs, where the intrinsic region has been supplemented with 5 quantum wells formed from GaAs. This provides absorption of photons with energies considerably less than the 1.85 eV band gap of GaInP as can be seen from the quantum efficiency in FIG. 8.

This extra range of absorption might be expected to yield a superior photocurrent compared with a structure in which the intrinsic region was of GaInP only. However, the very deep nature of the wells (i.e. low energy band gap) also means that the voltage of the junction is reduced, and the dark current significantly increased so that the overall performance as a solar cell junction is adversely affected, in comparison with the junction of FIG. 5.

Figure 8:
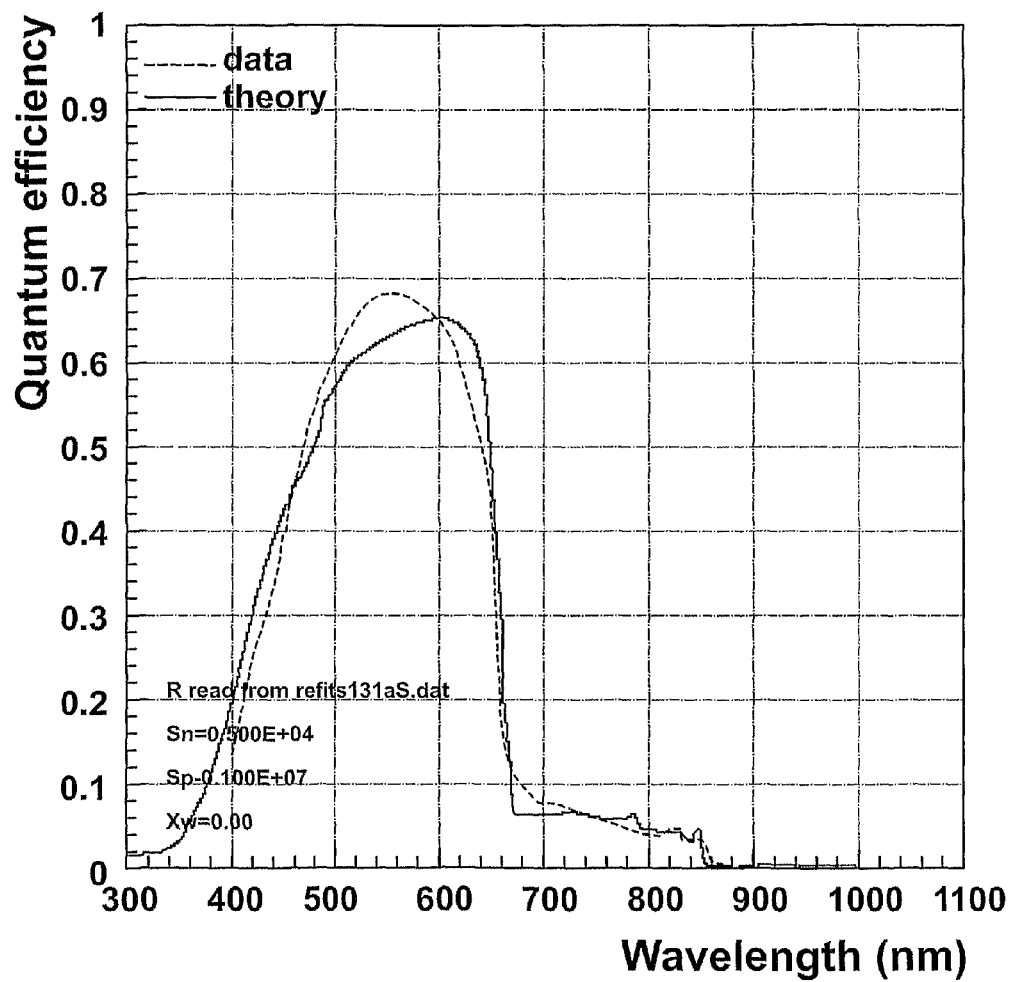
FIG. 8 is a plot of measured and modelled internal quantum efficiency for the device of FIG. 6.

Note also that the quantum efficiency in FIG. 8 is much lower (peak below 0.7) than the quantum efficiency on FIG. 7 (peak around 0.95). This indicates loss of electric field due to charged impurities in the intrinsic region.

In detail, the device of FIG. 6 comprises:
  500 nm thick n-buffer of GaAs n-doped at $1.0 \times 10^{18}$ cm$^{-3}$;
  60 nm minority carrier reflector layer of AlInP Si doped at $2.0 \times 10^{18}$ cm$^{-3}$;
  570 nm bulk n-region of GaInP Si doped at $1.0 \times 10^{17}$ cm$^{-3}$;
  five repeats of a barrier and well layer, the barrier being 60 nm of undoped GaInP, and the well layer being 6 nm of undoped GaAs;
  100 nm thick i-region buffer of undoped GaInP;
  100 nm bulk p-region Zn doped at $7.0 \times 10^{18}$ cm$^{-3}$
  30 nm window layer of AlInP Zn doped at $10^{18}$ cm$^{-3}$; and
  150 nm GaAs cap C doped at $2 \times 10^{20}$ cm$^{-3}$.

In FIG. 6 it can be seen that the fitted carrier lifetime is short, at only 23 ns, and the dark current above about 0.6V is dominated at all biases by Shockley-Read-Hall carrier loss, indicative of poor material quality in the quantum wells and an inefficient solar cell. Despite the high series resistance used (290 Ohms/m$^2$) neither the modelled nor the measured dark current ever approaches the radiative limit shown by the circles, and the measured dark current, even at high biases is several orders of magnitude greater than the current according to the ideal Shockley curve.

FIGS. 7 and 8 show the internal quantum efficiencies (heavy points) measured in laboratory tests of the same devices as used for the dark current plots of FIGS. 5 and 6 respectively. The quantum efficiency is the probability that a photon of a given wavelength is absorbed in the device with the resulting charge carriers being collected at the electrical contacts and resulting in a current passing through the cell. The area under the quantum efficiency curve, when weighted by the wavelength dependence of the incident light (for example a solar spectrum) is therefore proportional to the total photocurrent generated by the device. The internal quantum efficiency neglects loss of photons by reflection at the upper surface of the device. To measure the quantum efficiency of the upper cell alone, the device is illuminated using light of a wavelength which is only absorbed by the lower junction, and of sufficient intensity that the lower junction photocurrent is not limiting to the device. The measured quantum efficiency is then representative of the performance of the upper junction only.

For each of FIGS. 7 and 8, a simulation using the SOL model mentioned above was carried out. The simulation was used to calculate contributions to the quantum efficiency from each of the bulk p-, bulk n- and intrinsic i-regions. For both test devices, as expected, the contribution from the intrinsic region where the electric field rapidly sweeps newly photo generated charge carriers apart, dominates. A steep fall from the major peak in quantum efficiency occurs at the band edge of the bulk semiconductor material, which is GaInP in both cases, and is followed by a lower step which persists to higher wavelengths. This step results from photo absorption in the quantum wells of photons which have wavelengths too long to be absorbed in the bulk regions, with the extension to longer wavelengths being much greater for the GaAs wells than for the InGaAsP wells (because of the smaller band gap of GaAs), which as discussed above can give rise to a higher photocurrent (more photons absorbed) but a lower junction voltage (effective band gap of the junction is smaller). The greater number of InGaAsP quantum wells at 22 wells of 4.4 nm each for FIG. 7, compared with 5 GaAs wells of 6 nm each for FIG. 8, results in a relatively higher step due to the higher total absorption cross section of the quantum wells.

The comparison device with five GaAs quantum wells is characterised by a relatively poor quantum efficiency, peaking at around 68%. This indicates loss of electric field due to charged impurities in the intrinsic region due to interface recombination, dislocations and other imperfections. In contrast, the device having 22 wells of InGaAsP demonstrates a peak quantum efficiency in excess of 95%, dominated by the i-region contribution, indicative again of excellent material quality in the quantum wells and barriers. As already discussed, the structure and composition of elements of the quantum well region in the InGaAsP device can be easily adjusted to control the dimensions of the long wavelength step in the quantum efficiency curve, and hence the total photocurrent of the upper junction, in order to match the photocurrent of the lower junction. Moreover, this can be achieved over a diverse range of chosen conditions of solar illumination including anticipated variations in both spectrum and intensity.

Figure 9:
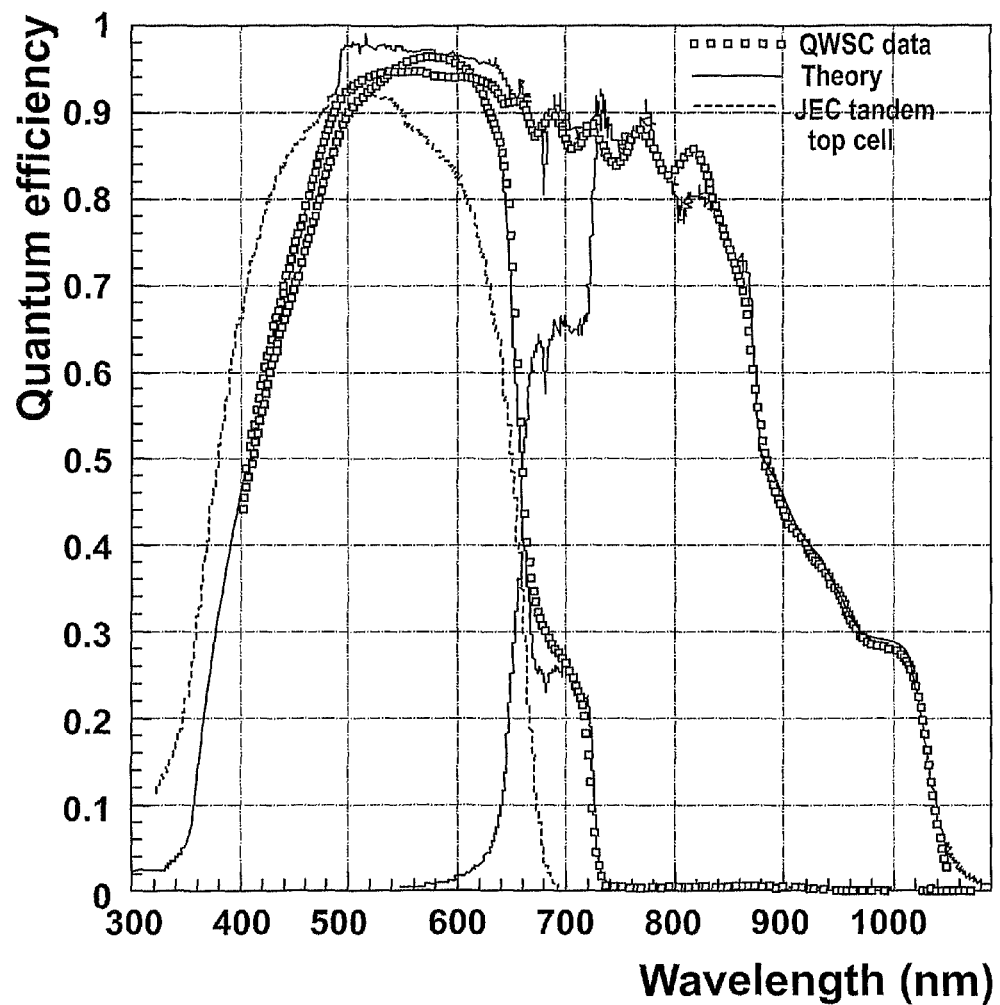
FIG. 9 is a plot of internal quantum efficiency for the device of FIGS. 5 and 7, but also showing the modelled values for a lower junction including 50 GaAsP quantum wells, measured and modelled values for the combined lower and upper junctions, and measured values for the top cell of a prior art tandem device.

FIG. 9 shows internal quantum efficiency measurements for the full tandem cell described in detail above, for which test results of the upper junction only are shown in FIGS. 5 and 7. Quantum efficiency calculated using the SOL model (thin continuous lines) is shown separately for each of the lower and upper junctions, and for the two junctions combined. Measured internal quantum efficiency (circles) is shown for the upper cell, and for the two junctions combined. For further comparison, the internal quantum efficiency of the top cell of the well known JEC tandem cell is shown in the heavier continuous line ("Over 30% efficient InGaP/GaAs tandem solar cells", T. Takamoto et al., Appl. Phys. Lett. 70, 381, 1997).

The step at wavelengths above the GaAs band edge at about 880 nm, extending to about 1040 nm, is due to absorption in the fifty InGaAs wells of the lower junction. The increased photocurrent associated with this step is matched in the upper photo junction by the relatively more modest step above the GaInP band edge in the quantum efficiency curve of the upper junction, which also leads to a corresponding dip in the quantum efficiency of the lower junction due to a decreased availability of photons in that wavelength range.

The upper junction multiple quantum well structure of quaternary GaInAsP is particularly convenient to grow using epitaxial techniques, such as MOVPE, because the incorporation of Arsenic into the material can be accurately controlled by a introduction of a controlled amount of Arsenic feed. The other group V element, Phosphorous, incorporates with difficulty into a GaAs type material and so a high density of Phosphorous feedstock or source material (usually Phosphine) is required. Arsenic incorporates much more easily, so that alternating layers of GaInP and GaInAsP can be grown with a accurate proportions of Arsenic by keeping the Phosphorous feed high, and turning on and off a small, accurately controlled Arsenic feed (usually of Arsine). In the detailed example given below it will be seen that to grow the alternating GaInP and GaInAsP layers the phosphine flow into the MOVPE chamber is kept at a level where Phosphorous incorporation is saturated, while Arsine is toggled on and off at a much lower level to provide the wells and barriers respectively. To maintain either lattice matching to GaAs or a strain balanced quantum well structure as required, Trimethylgallium is toggled between a higher and a lower feed concentration to produce wells and barriers respectively, for example by turning on and off two complementary inlets, while the Trimethylindium feed is kept constant at a saturation level.

A suitable MOVPE growth scheme to produce a structure similar to the second photovoltaic junction outlined above is provided in detail below. For clarity, the junction structure here is described as grown directly onto a GaAs substrate. It can of course instead be grown on top of a tunnel junction and/or other structures as required, and it will be seen that options for lattice matching both wells and barriers to GaAs, or providing a strain balanced MQW structure are provided. Further structures may be grown on top of the quantum wells also as required. The scheme is illustrated in FIG. 10.

1) A (100) n-GaAs substrate mis-oriented 10 degrees to (111)A is first positioned in an MOVPE reactor (Thomas Swan flip-top 7×2 shower-head) operating at 100 Torr pressure and a pure hydrogen carrier flow of 20 L/min. The substrate is heated over a period of 980 sec to reach a maximum pyrometer temperature of 720° C. to 730° C. (from 950 nm emission) in the presence of a 150 standard cc/min (sccm) flow of arsine. During this period surface oxides are removed from the substrate.

2) The substrate is then cooled to a pyrometer temperature of 670° C. while maintaining the Arsine flow at 150 sccm. A flow of Trimethylgallium vapour (TMG) of $1.86 \times 10^{-2}$ mole fraction is introduced resulting in the growth of 500 nm of GaAs (buffer layer) at a deposition rate of 0.83 nm/sec.

3) A 15.4 nm barrier layer of GaInP is then deposited by exchanging the Arsine flow for 250 sccm of Phosphine and simultaneously replacing the buffer layer TMG flow by a further TMG source of $4.2 \times 10^{-3}$ mole fraction, together with a Trimethylindium flow of $3.9 \times 10^{-3}$ mole fraction, resulting in the growth of tensile strained GaInP (53.3% Ga 46.7% In) at a growth rate of 0.38 nm/sec. Alternatively, the GaInP can be lattice matched with a composition of 51.3% Ga 48.75% In using an appropriate TMG flow.

4) A compressively strained quaternary QW is created by the simultaneously adding 2.3 sccm of Arsine to the reactor using a double diluted flow of Arsine in Hydrogen and exchanging the TMG for a further TMG source of $7.7 \times 10$ mole fraction; resulting in a Gallium fraction for the quaternary alloy of 64%. The compressively strained quaternary alloy with x=0.64 y=0.32 (mismatch $2.1 \times 10^{-3}$ compressive) is deposited for 10.3 sec resulting in a 4.4 nm thick quantum well layer. In the case of the barrier being lattice matched GaInP, the quaternary composition conditions are adjusted to provide a lattice matched composition.

5) A further barrier layer of GaInP is then deposited by exchanging TMG sources such that the Gallium fraction returns to 53.3% and Arsine is excluded from the reactor. The resulting MQW has a residual tensile strain of $5 \times 10^{-4}$, which could be optimised to a true strain balance structure by fine adjustment to the growth temperature or quaternary TMG flow.

6) Process steps 4 and 5 are repeated to create a multiple quantum well structure of typically 37 strain compensated GaInAsP/GaInP periods. Alternatively, the GaInP and GaInAsP could be lattice matched.

Figure 11:
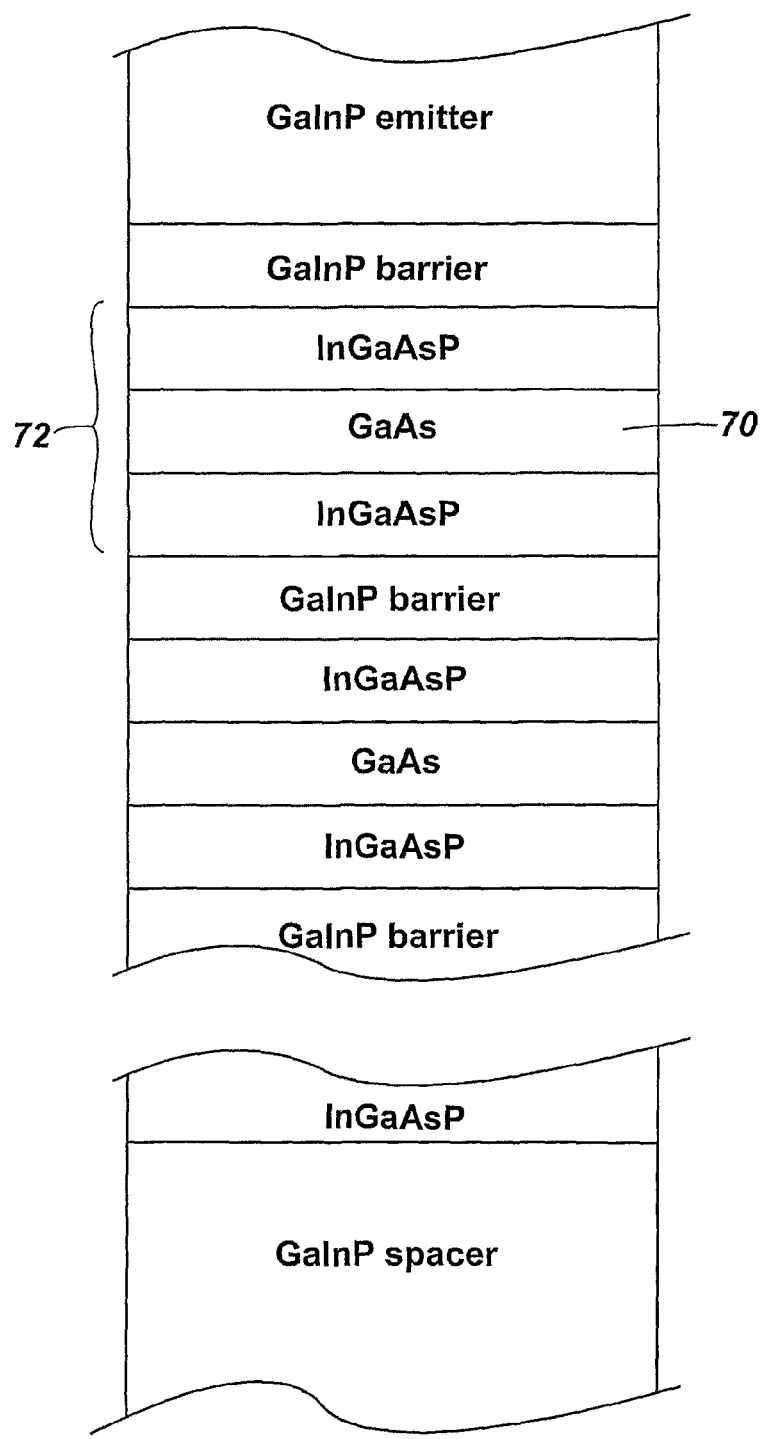
FIG. 11 shows a variation on the InGaAsP quantum well scheme in which a subwell of GaAs is provided to form a stepped structure.

FIG. 11 illustrates a further variation to the structure of FIGS. 3 and 4 discussed above. According to this variation, a subwell 70 of GaAs is grown within some or all of the quaternary InGaAsP quantum wells 72, such that a layer of InGaAsP separates each GaAs subwell 70 from each barrier layer 74, which may be of GaInP tertiary material as illustrated in the figure. As discussed above, the quantum well structure may be lattice matched, or parts such as the InGaAsP layers may contain a small degree of strain.

The quaternary composition may be as described above, or in a particular example, close to an alloy which would make quantum wells with an absorption band edge with a wavelength of about 735 nm using a GaAs substrate, namely $Ga_{0.62}In_{0.38}As_{0.34}P_{0.66}$. The thickness of the quaternary layers should be sufficiently small so as not to be phase separated. The InGaAsP layers provide a transition material from GaInP to GaAs, the transition material containing As, which consequently improves the GaInP to GaAs interface quality. Quantum well structures which transition directly between GaInP barriers and GaAs wells have an interface change from As and no P, to P and no As, and exhibit a relatively poor luminescence yield, presumably due to non-radiative recombination centres at the well-barrier interface.

Typical dimensions for the stepped multiple quantum well structure of FIG. 11 could be thicknesses of 1.7 nm for the InGaAsP layers, and 2.0 nm for the GaAs layers, achieving emission at about 850 nm. A multiple quantum well structure based on the quaternary composition as the only barrier material and GaAs as the well material does not provide any confined electron states. The GaInP barrier layer is therefore needed to allow the arrangement to operate.

The table below provides structural details for a device or junction which can be grown to demonstrate the stepped wells arrangement of FIG. 11. The table provides layer thicknesses, doping types, doping densities in $cm^{-3}$ and photoluminescent wavelength in nm of the layers where appropriate.

| Function | Repeats | Material | Thickness nm | Doping type | Doping density | PL wavelength nm |
|---|---|---|---|---|---|---|
| Cap | | GaAs | 200 | Si | $1.0 \times 10^{18}$ | |
| Emitter | | GaInP | 200 | Si | $4.0 \times 10^{18}$ | |
| Barrier | 50 | GaInP | 15 | | Undoped | |
| Step | 50 | GaInAsP | 17 | | Undoped | 730 |
| Well | 50 | GaAs | 17 | | Undoped | 855 |
| Step | 50 | GaInAsP | 17 | | Undoped | 730 |
| Spacer | | GaInP | 50 | | Undoped | |
| Base | | $Al_{0.45}GaAs$ | 200 | C | $1.0 \times 10^{19}$ | |
| Buffer | | GaAs | 200 | C | $1.0 \times 10^{18}$ | |

Figure 12:
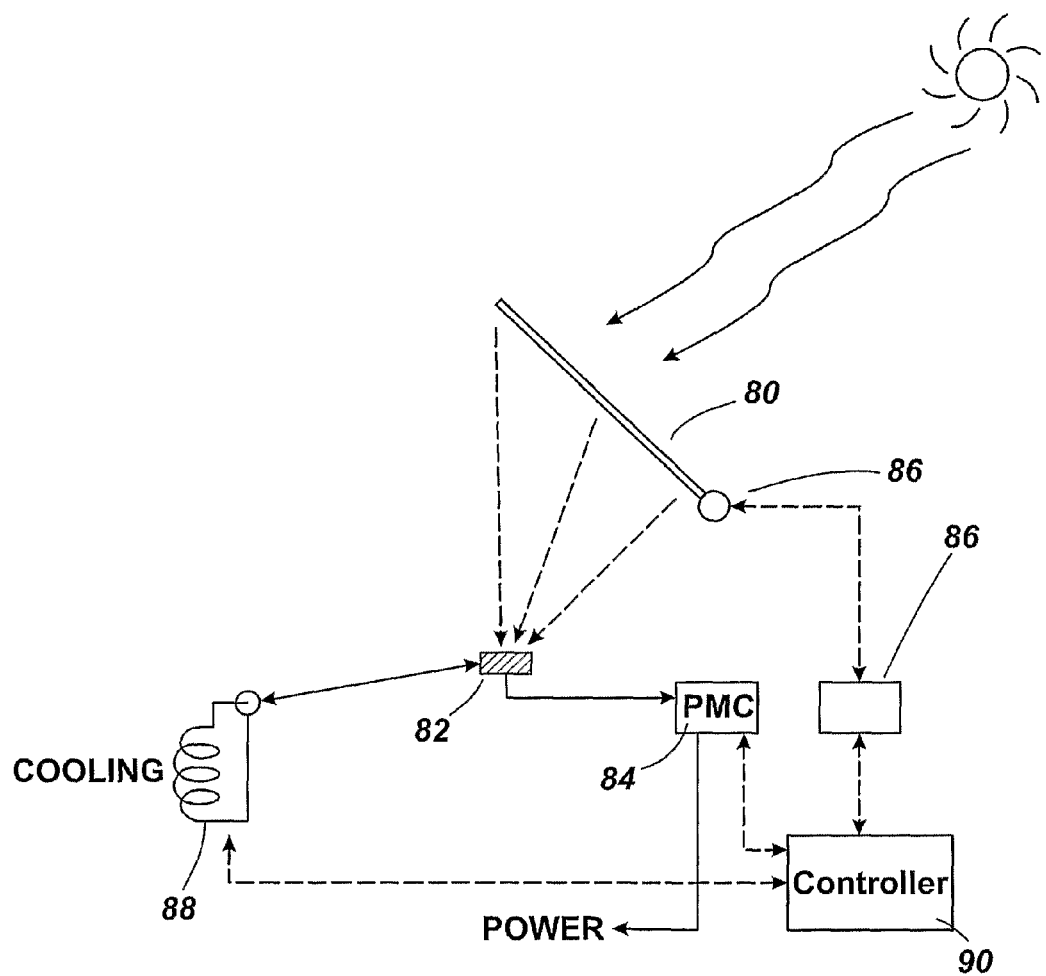
FIG. 12 illustrates a concentrator system for using the discussed photovoltaic cells.

Photovoltaic junctions and solar cells as described above may in particular be used in concentrator solar cell applications, in which sunlight is concentrated typically between about 50 and 1000 times and directed to concentrator solar cells which are typically each of only about 0.1 $mm^2$ to about 200 $mm^2$ in surface area. Such a system, illustrated in FIG. 12, may comprise, for example, an optical concentrator element 80, a plurality of solar cells 82, and power management circuitry 84 for gathering power from the solar cells for suitable onward supply. A tracking system 86 may be used to ensure that the optical concentrator is suitably directed at the Sun so that the concentrator solar cells are operated at an optimum efficiency as much as possible. Cooling apparatus 88 may be required to maintain the solar cells at a suitable working temperature. In FIG. 12 a computerised controller unit 90 integrates control of the various subsystems.

Although particular embodiments have been described, it will be apparent that a variety of modifications may be made without departing from the scope of the invention. For example, although quantum well, barrier and other layers of various materials and thicknesses have been described, this does not exclude the addition of layers of different properties within the described structures, such as one or more wells or barriers having alternative compositions and/or thicknesses. Where binary and ternary semiconductor materials have been mentioned, modifications to these materials including suitable ternary and quaternary materials may be used if appropriate.

The bulk semiconductor regions formed of GaInP may also be formed of other materials, for example having similar lattice size and/or band gap characteristics, such as closely related quaternary compounds including GaInP based quaternaries with additional Al, As, N or Sb, as may the upper cell barrier structures Whereas some substrates such as GaAs have been described, other substrate materials, and schemes such as virtual and relaxed substrates may be used as appropriate. Similarly, bulk semiconductor layers of different materials, properties and thicknesses may be used, including reversal of p- and n-doping schemes and similar.

The invention claimed is:

1. A solar cell comprising a first photovoltaic junction, the first photovoltaic junction comprising: first and second doped bulk semiconductor regions; and an intrinsic region disposed between the doped bulk regions, the intrinsic region comprising a plurality of quantum wells formed of bulk-immiscible quaternary InGaAsP and separated by quantum barriers, wherein the relative proportions of As and P in the quaternary InGaAsP are given by $As_y$ and $P_{1-y}$, where $0.2 \leq y \leq 0.5$, wherein the relative proportions of In, Ga, As and P are such that the InGaAsP is lattice matched to within 2% of the lattice constant of GaAs or Germanium.

2. The solar cell of claim 1 wherein the relative proportions of As and P are given by $As_y$ and $P_{1-y}$, where $0.25 \leq y \leq 0.45$.

3. The solar cell of claim 1 in which at least some of the quantum barriers are formed of a semiconductor material comprising Ga, In and P.

4. The solar cell of claim 3 wherein at least some of the quantum barriers are formed of tertiary GaInP.

5. The solar cell of claim 1 wherein at least one of the doped bulk semiconductor regions is formed of a doped semiconductor material comprising Ga, In and P.

6. The solar cell of claim 1 wherein some or all of the quantum wells are formed of InGaAsP in which the relative proportions of In, Ga, As, and P are such that these quantum wells are lattice matched to at least one of: the first doped bulk semiconductor region; the second doped bulk semiconductor region; and an underlying substrate.

7. The solar cell of claim 1 wherein the quantum wells and quantum barriers have compositions and thicknesses such that the plurality of quantum wells and barriers provide compensating compressive and tensile stresses which balance at a common lattice spacing matched to that of an underlying substrate and/or that of at least one of the doped bulk semiconductor regions.

8. The solar cell of claim 1 wherein the absorption band edge of the quantum wells has a wavelength of between 700 and 740 nm.

9. The solar cell of claim 1 wherein the intrinsic region comprises at least twenty of said quantum wells.

10. The solar cell of claim 1 wherein some or all of the InGaAsP quantum wells are less than 15 nm thick.

11. The solar cell of claim 1 wherein at least some of said quantum wells comprise a subwell of GaAs, separated from the barriers by the quaternary InGaAsP.

12. The solar cell of claim 1, further comprising an underlying substrate.

13. The solar cell of claim 12 wherein the underlying substrate is one of: GaAs, Germanium, and a substrate substantially lattice matched to GaAs or Germanium.

14. The solar cell of claim 13 wherein the substrate is cut to an angle of more than 2 degrees from (100) to the <111> or <110> crystal plane.

15. The solar cell of claim 12 wherein the solar cell comprises a second photovoltaic junction disposed between the first photovoltaic junction and the substrate, to form a tandem cell of two or more photovoltaic junctions in which a common photocurrent passes through all the junctions.

16. The solar cell of claim 15 wherein the second photovoltaic junction has an absorption edge wavelength of at least 1000 nm, which is greater than that of the first photovoltaic junction.

17. The solar cell of claim 16 wherein the second photovoltaic junction comprises an intrinsic region containing a plurality of quantum wells.

18. The solar cell of claim 17 wherein at least some of the quantum wells of the second junction are formed of InGaAs.

19. The solar cell of claim 18 wherein the quantum wells of the second photovoltaic junction are disposed between quantum barriers at least some of which are formed of GaAsP, and the quantum wells and quantum barriers of the second photovoltaic junction have compositions and thicknesses such that the plurality of quantum wells and barriers provide compensating compressive and tensile stresses which balance at a common lattice spacing matched to that of the underlying substrate.

20. The solar cell of claim 12 wherein the first and second photovoltaic junctions are adapted such that the photocurrents of the junctions match for a predefined illumination condition.

21. A photovoltaic system for generating electrical power from solar illumination comprising: a solar cell as set out in claim 12; and a concentrator arranged to deliver concentrated sunlight at the surface of the solar cell.

22. The photovoltaic system of claim 21 wherein the concentrator delivers said sunlight concentrated by at least 50 times.

23. A method of forming a solar cell photovoltaic junction using epitaxial growth, comprising: growing a first doped bulk semiconductor layer; growing on top of the first doped bulk layer an intrinsic region comprising quantum well layers of quaternary InGaAsP separated by quantum barrier layers, the quantum wells being formed of bulk-immiscible quaternary InGaAsP; and growing a second doped bulk semiconductor layer on top of the intrinsic region;
wherein the quantum well layers have the relative proportions of As and P given by $As_y$ and $P_{1-y}$ where $0.2<=y<=0.5$, wherein the relative proportions of In, Ga, As and P are such that the InGaAsP is lattice matched to within 2% of the lattice constant of GaAs.

24. The method of claim 23 wherein some or all of the InGaAsP quantum wells are less than 15 nm thick.

25. The method of claim 23 wherein one or more of the barrier layers are formed of a semiconductor material comprising Ga, In and P.

26. The method of claim 25 wherein said one or more of the barrier layers are formed of tertiary GaInP.

27. The method of claim 25 wherein the transition from growth of a quantum barrier layer to a quantum well layer is carried out by the controlled introduction of an Arsenic source along with a corresponding controlled reduction of a Gallium source, and a subsequent transition to growth of a quantum well layer is carried out by the ceasing of the Arsenic source along with a corresponding controlled increase in the Gallium source.

28. The method of claim 23 wherein one or more of the doped bulk semiconductor layers are formed of a semiconductor material comprising Ga, In and P, or a related material having a band edge between 640 and 700 nm.

29. The method of claim 23 wherein growing one or more of the quantum well layers of InGaAsP comprises growing a subwell layer of GaAs separated from barrier layers by the InGaAsP material.

30. A solar cell photovoltaic junction comprising: first and second doped bulk semiconductor regions lattice matched to GaAs, at least one of which bulk regions is formed of a semiconductor material comprising Ga, In and P; and an intrinsic region disposed between the bulk regions comprising a plurality of quantum well layers separated by quantum barrier layers, the quantum well layers being formed of bulk immiscible quaternary GaInAsP, in which relative proportions of As and P are given by $As_y$ and $P_{1-y}$, where $0.2<=y<=0.5$, wherein the relative proportions of In, Ga, As and P are such that the InGaAsP is lattice matched to within 2% of the lattice constant of GaAs or Germanium.

31. The photovoltaic junction of claim 30 wherein the quantum wells layers are separated by barrier layers formed of a semiconductor material comprising Ga, In and P.

32. A method of providing an extended absorption edge in a GaInP based photovoltaic junction lattice matched to GaAs or Ge, which includes an intrinsic region having multiple quantum wells therein, comprising forming at least some of the quantum wells from a bulk-immiscible quaternary InGaAsP material, separated by quantum barrier layers, wherein relative proportions of As and P in the quaternary bulk-immiscible InGaAsP material are given by $As_y$ and $P_{1-y}$, where $0.2<=y<=0.5$, wherein the relative proportions of In, Ga, As and P are such that the InGaAsP is lattice matched to within 2% of the lattice constant of GaAs or Germanium.

* * * * *